(12) United States Patent
Oikawa et al.

(10) Patent No.: US 6,967,139 B2
(45) Date of Patent: Nov. 22, 2005

(54) METHOD OF MANUFACTURING SEMICONDUCTOR DEVICE

(75) Inventors: Makoto Oikawa, Ora-gun (JP); Hiroki Etou, Gunma (JP); Hirotoshi Kubo, Ora-gun (JP); Shouji Miyahara, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/893,223

(22) Filed: Jul. 19, 2004

(65) Prior Publication Data

US 2004/0256667 A1 Dec. 23, 2004

Related U.S. Application Data

(62) Division of application No. 10/253,901, filed on Sep. 25, 2002, now Pat. No. 6,828,626.

(30) Foreign Application Priority Data

Sep. 25, 2001 (JP) .............................. 2001-290751
Sep. 6, 2002 (JP) .............................. 2002-261011

(51) Int. Cl.$^7$ ......................................... H01L 21/8234
(52) U.S. Cl. ...................................... 438/270; 438/259
(58) Field of Search ................................. 438/259, 270

(56) References Cited

U.S. PATENT DOCUMENTS

| 5,721,173 | A | * | 2/1998 | Yano et al. | 438/424 |
| 5,851,928 | A | * | 12/1998 | Cripe et al. | 438/748 |
| 5,945,708 | A | * | 8/1999 | Tihanyi | 257/331 |
| 6,445,113 | B1 | * | 9/2002 | Seko et al. | 313/309 |
| 6,790,742 | B2 | * | 9/2004 | Yang et al. | 438/401 |

FOREIGN PATENT DOCUMENTS

JP 11176923 A * 7/1999 .......... H01L 21/76

* cited by examiner

*Primary Examiner*—Allan R. Wilson
(74) *Attorney, Agent, or Firm*—Morrison & Foerster LLP

(57) ABSTRACT

In a conventional power MOSFET, an electric field concentration occurs at a gate electrode bottom portion on the outermost periphery of an operating area, thereby causing a deterioration in high voltage strength between the drain and the source, or between the collector and emitter. In this invention, a trench at the outermost periphery of an operating area is shallower than trenches of the operating area. Thereby, the electric field concentration at the gate electrode bottom portion on the outermost periphery of the operating area is relieved, and a deterioration in high voltage strength between the drain and source is suppressed. Furthermore, by narrowing the outermost peripheral trench aperture portion, trenches different in depth can be formed by an identical step.

13 Claims, 12 Drawing Sheets

METHOD OF MANUFACTURING SEMICONDUCTOR DEVICE

REFERENCE TO RELATED APPLICATION

This application is a division of Ser. No. 10/253,901, filed Sep. 25, 2002, now U.S. Pat. No. 6,828,626.

BACKGROUND OF THE INVENTION

1. Field of the Invention

The invention relates to a semiconductor device and a method for manufacturing the same and, specifically, to a semiconductor device wherein an electric field concentration at a trench bottom portion of the outermost periphery of an operating area is relieved and a deterioration in high voltage strength is suppressed, and a method for manufacturing the same.

2. Description of Related Art

A conventional semiconductor device is shown in FIG. 12 using a trench-type N-channel power MOSFET (Metal Oxide Semiconductor Field Effect transistor) as an example.

On an $N^+$ type silicon semiconductor substrate 21, a drain region 22 formed of an $N^-$ type epitaxial layer is provided, and on the surface thereof, a P type channel layer 24 is provided. The channel layer 24 has a uniform forming depth across the entire surface of an operating area of the device, and on a peripheral end portion of the channel layer 24 outside the operating area, a $P^+$ type region 24a for securing a high voltage strength is provided.

A trench 27 which penetrates through the channel layer 24 and reaches the drain region 22 is provided, the inner wall of the trench 27 is coated with a gate oxide film 31, and a gate electrode 33 made of polysilicon filled in the trench 27 is provided. On the channel layer surface adjacent to the trench 27, an $N^+$ type source region 35 is formed, and on the channel layer surface between two adjacent cells of such source regions 35, a $P^+$ type body contact region 34 is provided. Furthermore, on the channel layer 24, a channel region (not shown) is formed, extending from the source region 35, along the trench region 27. The top of the gate electrode 33 is covered with an interlayer insulating film 36, and a source electrode 37 which makes contact with the source regions 35 and body contact regions 34 is provided.

Referring to FIG. 13 to FIG. 18, a conventional method for manufacturing a semiconductor device is shown using the trench-type N-channel power MOSFET as an example.

As shown in FIG. 13, an $N^-$ type epitaxial layer is formed to become a drain region 22 on an $N^+$ type silicon semiconductor substrate 21. Into a peripheral end portion of a predetermined channel layer 24 outside an operating area, a P type impurity of a high concentration is doped and diffused to form a $P^+$ type region 24a (not shown in FIGS. 13–18).

Furthermore, an impurity such as boron is doped with a dosage in the order of $10^{13}$ into the entire surface and is then diffused to form a P type channel layer 24.

FIGS. 14 and 15 show steps for forming trenches are shown.

In FIG. 14, by a CVD (Chemical Vapor Deposition) method, an NSG (non-doped silicate glass) CVD oxide film 25 is created with a thickness of several thousand Å on the entire surface. Using a mask made of a resist film formed on the oxide film except the portions to become trench aperture portions 26, the CVD oxide film 25 is partially removed by dry etching so that the trench aperture portions 26 where channel regions 24 are exposed are formed.

In FIG. 15, using the CVD oxide film 25 as a mask, the silicon semiconductor substrate under the trench aperture portions 26 is dry-etched by a CF gas and an HBr gas to form trenches 27 having a depth to penetrate through the channel layer 24 and reach the drain region 22.

In FIG. 16, as dummy oxidation, an oxide film (not shown) is formed on the inner walls of the trenches 27 and the surface of the channel layer 24 to remove etching damage during the dry etching. Thereafter, this dummy oxide film and the CVD oxide film 25 are removed by etching. Then, a gate oxide film 31 is formed. Namely, by applying thermal oxidation to the entire surface, a gate oxide film 31 is formed with, for example, a thickness of approximately several hundred Å.

In FIG. 17, gate electrodes 33, which fill the inside of the trenches 27, are formed.

Namely, a non-doped polysilicon layer 32 is deposited on the entire surface including the trenches, and phosphorus is doped and diffused at a high concentration so as to realize a high conductivity. Thereafter, the polysilicon layer adhered to the entire surface is dry-etched without a mask so that the gate electrodes 33 filling the trenches 27 are left.

In FIG. 18, by use of a mask made of a resist film, boron is selectively ion-implanted with a dosage in the order of $10^{15}$ to form $P^+$ type body regions 34, and then the resist film is removed.

Thereafter, while masking is provided by a new resist film so as to expose predetermined source regions 35 and gate electrodes 33, arsenic is ion-implanted with a dosage in the order of $10^{15}$ to form $N^+$ type source regions 35 on the channel layer surface adjacent to the trenches 27, and then the resist film is removed.

Furthermore, a BPSG (boron phosphorous silicate glass) layer is deposited on the entire surface by a CVD method so that an interlayer insulating film 36 is formed. Thereafter, by use of a resist layer as a mask, the interlayer insulating film 36 is removed except at least the portions on the gate electrodes 33. Thereafter, aluminum is deposited on the entire surface by a sputtering device to form a source electrode 37 which makes contact with the source regions 35 and body contact regions 34.

In this trench-type high-voltage MOSFET, when a drive voltage equal to or higher than a threshold voltage is applied to the gate electrode, providing that a power supply voltage is applied the source electrode and the drain electrode with the drain electrode receiving a positive voltage, a channel region is formed in the channel layer along the trench, and an electric current flows through the channel region. In this manner, the MOSFET is turned on.

On the other hand, if the drive voltage is less than a threshold voltage, the MOSFET is turned off.

In this conventional trench-type high-voltage MOSFET, when the device is turned off, a depletion layer spreads as shown by the broken lines in FIG. 12 from a PN junction, under a reverse bias, at the interface between the channel layer 24 and drain region 22. This works as a depletion layer when a drive voltage $V_0$ is applied. Since the $N^-$ epitaxial layer of the drain region 22 is low in impurity concentration compared to the P type channel layer 24, the depletion layer mostly extends in the direction of the drain region 22 and retains a drain voltage.

In this configuration, compared to the bottom edge of the trench 27 in the actual operation area, the bottom edge of the outermost peripheral trench 27a has a greater electric field intensity, therefore, an electric field concentration occurs in this region, as described below.

First, an electric field intensity E of the bottom edge of each trench is given by the following equation:

$$E = V_0/d$$

In the above equation, d is a distance from the bottom edge of each trench to the closest drain region side depletion layer edge. As shown in FIG. 12, this value is d11 for the outermost peripheral trench 27a, and d12 for the trench 27 in the operating area.

In addition, the depletion layer which spreads to the drain region 22 is continuous, whereas the depletion layer which spreads to the channel layer 24 is separated into isolated portions by the trenches, which do not allow formation of the depletion layer inside thereof because of the insulating layer. In the operating area, since the trenches 27 provides isolation and, also, the impurity concentration of the channel layer 24 is higher than the impurity concentration of the drain region 22, the depletion layer spreads toward the channel layer side to a lesser extent and than the drain region side. On the other hand, outside of the outermost peripheral trench 27a, there is a sufficient distance to the P+ region and no restriction due to trenches 27 on the channel layer side. Therefore, the depletion layer spreads to a greater extent toward to the channel layer side than in the operating area. Furthermore, for a fixed applied voltage $V_0$, the width $d_0$ of the depletion layer at its widest portion is almost equal regardless its location, i.e., the inside of the operating area and periphery thereof.

That is, outside of the outermost peripheral trench 27a, the depletion layer in the channel layer side easily spreads and, accordingly, the spread of the depletion layer toward the drain region side becomes less than that of the inside of the operating area.

Consequently, the distance from the bottom edge of the trench to the depletion layer edge becomes narrower than that of the trench 27 (d12>d11). In this configuration, inside the operating area, the trenches 27 are arranged at even intervals and the depletion layer evenly spreads accordingly. Therefore, the distance d is shorter only at the outermost peripheral trench 27a.

Thus, the electric field intensity E of the trench has a greatest value at the outermost peripheral trench 27a, and an electric field concentration occurs in this location.

This leads to a reduction in the high voltage strength between the drain and the source. In a case of an IGBT (Insulated Gate Bipolar Transistor), the pertinent portion is between the collector and emitter. At a high temperature, the high voltage strength may become less than the allowable maximum high voltage.

For example, a characteristic diagram showing a collector-emitter voltage (VCES) as a function of a temperature (Ta) is shown in FIG. 19. According to this diagram, at an ambient temperature of 75° C. or higher, the VCES value is low due to an electric field concentration, resulting in negative temperature characteristics. Therefore, there has been a major problem in deterioration in high voltage strength between the collector and emitter due to an electric field concentration.

SUMMARY OF THE INVENTION

The invention provides a semiconductor device including an operating area, a plurality of first trench-type transistors provided in the outermost peripheral of the operating area, and a plurality of second trench-type transistors provided in the operating area inside the outermost peripheral. In this configuration, a trench depth of the first trench-type transistors is shorter than a trench depth of the second trench-type transistors.

The invention also provides a method for manufacturing a semiconductor device. The method includes preparing a mask having a first aperture and a second aperture. The first and second apertures have different aperture sizes. The method also includes providing a semiconductor substrate and forming a first trench and a second trench in the semiconductor substrate using the mask in one process step.

The invention further provides another method for manufacturing a semiconductor device. The method includes forming a region of a first conduction type on a semiconductor substrate of a second conduction type, and forming a plurality of first trenches in an outermost peripheral of a predetermined area of the semiconductor substrate and a plurality of second trenches in the predetermined area inside the outermost peripheral. The first trenches have a depth shorter than the second trenches. The predetermined area corresponds to an operating area of the semiconductor device. The method also includes forming insulating films on inner surfaces of the first and second trenches, filling the first and second trenches with a semiconductor material to form electrodes, and forming regions of the second conduction type in a surface of the region of the first conduction type. Each of the regions of the second conduction type is adjacent one of the first and second trenches. In this configuration, the region of a first conduction type may be a channel layer and a surface of the semiconductor substrate may serve as a drain region of the semiconductor device. Furthermore, the regions of the second conductivity type may be source regions.

The invention also provides a method for manufacturing a semiconductor device. The method includes preparing a mask having a first aperture, a second aperture and a third aperture. Each of the first, second and third apertures has a different aperture size. The method further includes providing a semiconductor substrate, and forming a first trench, a second trench and a third trench in the semiconductor substrate using the mask in one process step.

The invention further provides another method for manufacturing a semiconductor device. The method includes forming a region of a first conduction type on a semiconductor substrate of a second conduction type, and forming a plurality of first trenches in an outermost peripheral of a predetermined area of the semiconductor substrate, a plurality of second trenches in the predetermined area inside the first trenches and a plurality of third trenches in the predetermined area inside the second trenches. The second trenches having a depth shorter than the third trenches and longer than the first trenches. The predetermined area corresponds to an operating area of the semiconductor device. The method also includes forming insulating films on inner surfaces of the first, second and third trenches, filling the first, second and third trenches with a semiconductor material to form electrodes, and forming regions of the second conduction type in a surface of the region of the first conduction type. Each of the regions of the second conduction type is adjacent one of the first second and third trenches. In this configuration, the region of a first conduction type may be a channel layer and a surface of the semiconductor substrate may serve as a drain region of the semiconductor device. Furthermore, the regions of the second conductivity type may be source regions.

DETAILED DESCRIPTION OF THE INVENTION

Hereinafter, embodiments of the invention will be described in detail using a trench-type N-channel power MOSFET as example.

First, a semiconductor device of a first embodiment of the invention will be described with reference to FIG. 1 through FIG. 8.

Figure 1:
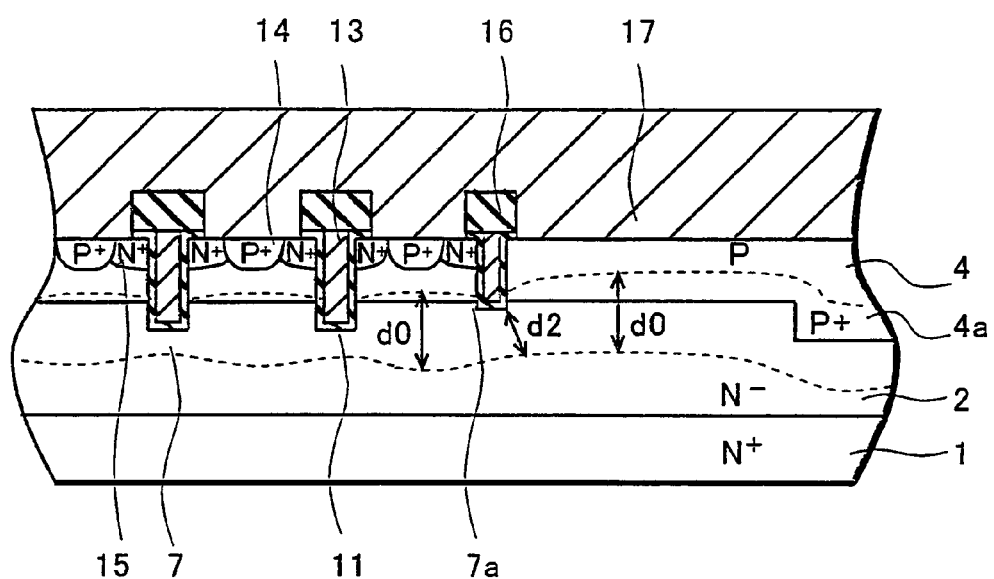
FIG. 1 is a sectional view of a semiconductor device of a first embodiment of the invention.

FIG. 1 shows a cross-sectional view of the power MOSFET of the first embodiment.

The trench-type power MOSFET includes a semiconductor substrate 1 and 2, a channel layer 4, trenches 7 and 7a, gate oxide films 11, gate electrodes 13, source regions 15, and a metal electrode 17.

As the semiconductor substrate, an $N^-$ type epitaxial layer is formed on an $N^+$ type silicon semiconductor substrate 1 so as to become a drain region 2.

The channel layer 4 is a diffusion region, which is formed by selectively doping P type boron or the like in the surface of the drain region 2. The channel layer 4 has a depth shallower than the trenches 7 located inside of an operating area. The operating area is defined by a group of transistors occupying a predetermined portion of a chip surface. In FIG. 1, all three transistors are located in the operating area, with two deeper trenches being inside the operating area and the shortest trench being at the outermost peripheral of the operating area. At regions of this channel layer 4 adjacent to the trenches 7, channel regions (not shown) are formed. The channel layer 4 has an uniform depth across the entire surface of the operating area. On a peripheral end portion of the channel layer 4 outside the operating area, a $P^+$ type region for securing a high voltage strength is provided.

The trenches 7 are provided so as to penetrate through the channel layer 4 and reach the drain region 2, and are generally arranged in a form of a lattice or a strips on the surface of the semiconductor substrate.

The outermost peripheral trench 7a of the operating area is shallower in depth than other trenches 7, and this trench 7a need not reach the drain region 2. On the inner walls of the trenches 7 and 7a, gate oxide films 11 are provided. Polysilicon fills the trenches to form gate electrodes.

The gate oxide film 11 is provided on the inner wall of the trench 7, 7a along at least the channel layer 4 so as to have a thickness of several hundred Å depending on the drive voltage. Since the gate oxide film 11 is an insulating film, the transistor has a MOS structure between the gate electrode 13 provided in the trench 7, 7a and the semiconductor substrate.

The gate electrode 13 is formed of polysilicon filling the trench 7, 7a. A P type impurity has been doped in this polysilicon to provide a low resistance. This gate electrode 13 extends to a gate connecting electrode (not shown) surrounding the semiconductor substrate and is connected to a gate pad electrode (not shown) provided on the semiconductor substrate.

The source region 15 is a diffusion region, which is formed by doping an $N^+$ type impurity in the channel layer 4 surface adjacent to the trench 7, 7a, and comes in contact with the metal source electrode 17 covering the operating area. In addition, on the channel layer surface between adjacent source regions 15, a body contact region 14 as a diffusion region of a $P^+$ type impurity is provided so that the potential of the substrate is stabilized.

The interlayer insulating film 16 is provided for insulation between the source electrode 17 and gate electrode 13, covering, at least, the gate electrode 13. A part of the insulating film 16 is left at the trench openings.

The source electrode 17 is patterned to form a desirable shape by sputtering aluminum or the like. This source electrode 17 covers the operating area and comes in contact with the source regions 15 and body contact regions 14.

An area surrounded by adjacent trenches 7, 7a forms one cell, which typically has a rectangular shape. One cell typically includes one transistor. Accordingly, a plurality of such cells are arranged to form the operating area.

In this trench-type high-voltage MOSFET, when a drive voltage equal to or higher than a threshold voltage is applied to the gate electrode 13, providing that a power supply voltage is applied the source electrode and the drain electrode with the drain electrode receiving a positive voltage, a channel region is formed in the channel layer 4 along the trench 7, and an electric current flows through the channel region. In this manner, the MOSFET is turned on.

On the other hand, if the drive voltage is less than a threshold voltage, the MOSFET is turned off.

The invention is characterized in that the depth of the outermost peripheral trench 7a in the operating area is shallower than that of other trenches 7 within the operating area.

In this trench-type high-voltage MOSFET, when it is off, a depletion layer spreads as shown by the broken lines in FIG. 1 from a PN junction, under a reverse bias, at the interface between the channel layer 4 and drain region 3. This works as a depletion layer when a drive voltage $V_0$ is applied. Since the N⁻ epitaxial layer as the drain region 2 is low in impurity concentration compared to the P type channel layer 4, the depletion layer mostly extends in the direction of the drain region 2 and retains a drain voltage.

Figure 12:
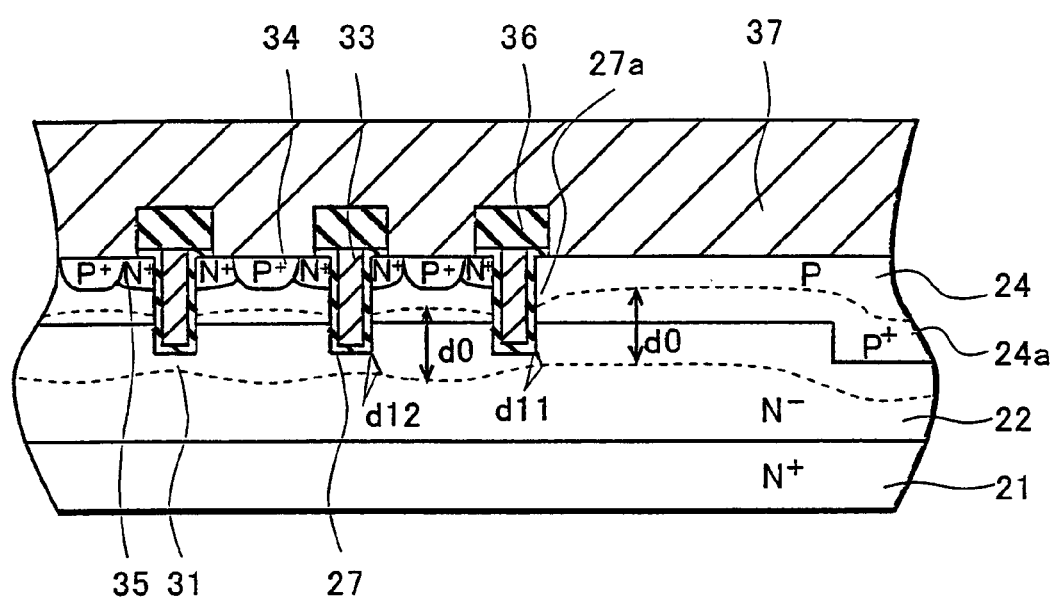
FIG. 12 is a sectional view of a conventional semiconductor device.
Figure 13:
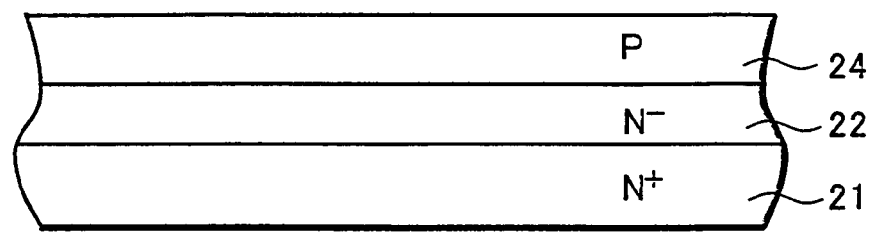
FIG. 13 is a sectional view of a device intermediate of a processing step for manufacturing the device of FIG. 12.
Figure 14:
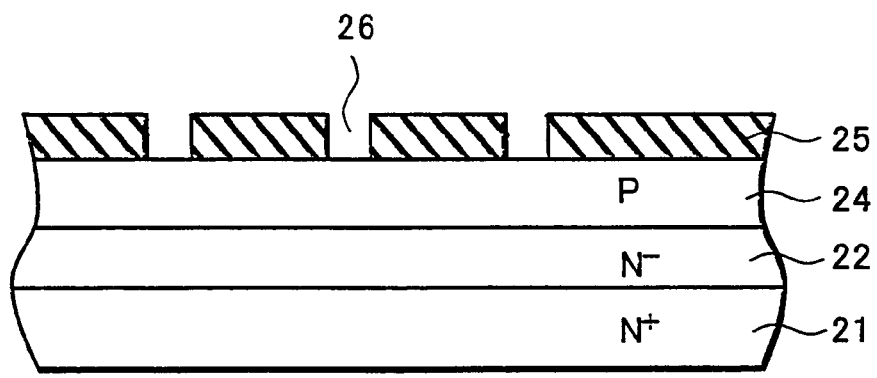
FIG. 14 is a sectional view of a device intermediate of a processing step for manufacturing the device of FIG. 12, following the step of FIG. 13.
Figure 15:
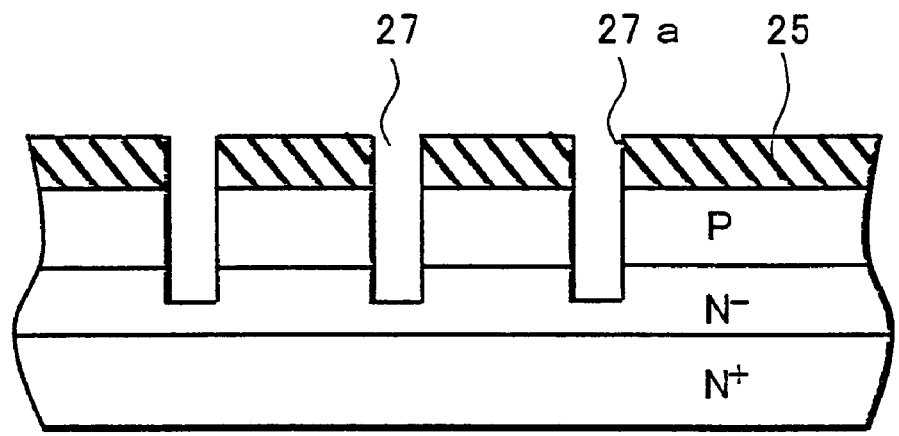
FIG. 15 is a sectional view of a device intermediate of a processing step for manufacturing the device of FIG. 12, following the step of FIG. 14.
Figure 16:
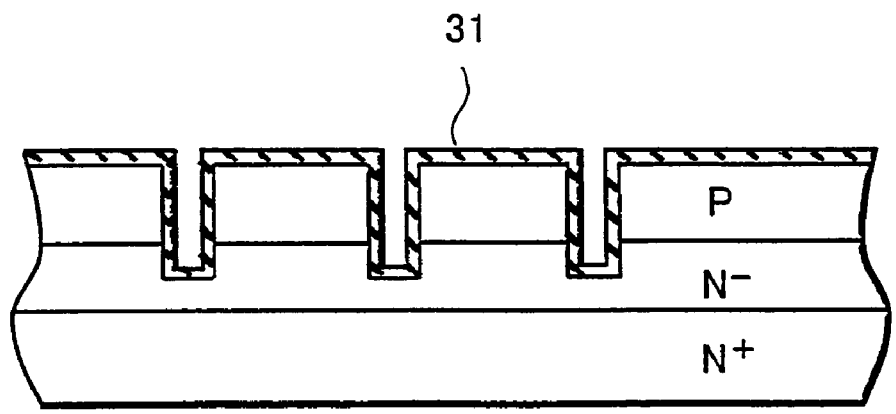
FIG. 16 is a sectional view of a device intermediate of a processing step for manufacturing the device of FIG. 12, following the step of FIG. 15.
Figure 17:
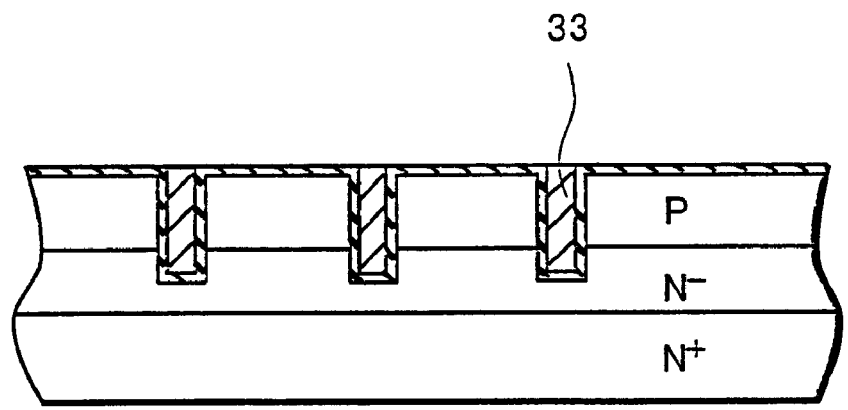
FIG. 17 is a sectional view of a device intermediate of a processing step for manufacturing the device of FIG. 12, following the step of FIG. 16.
Figure 18:
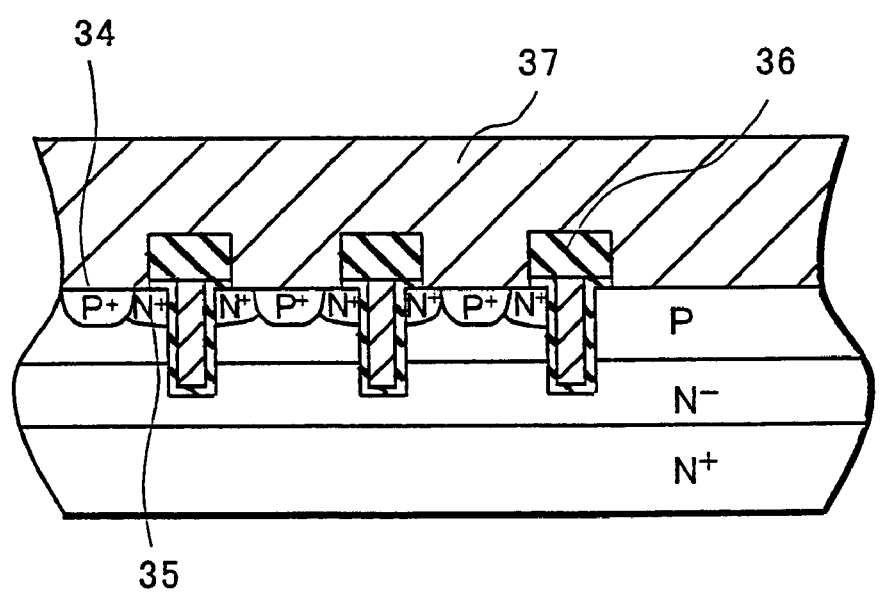
FIG. 18 is a sectional view of a device intermediate of a processing step for manufacturing the device of FIG. 12, following the step of FIG. 17.
Figure 19:
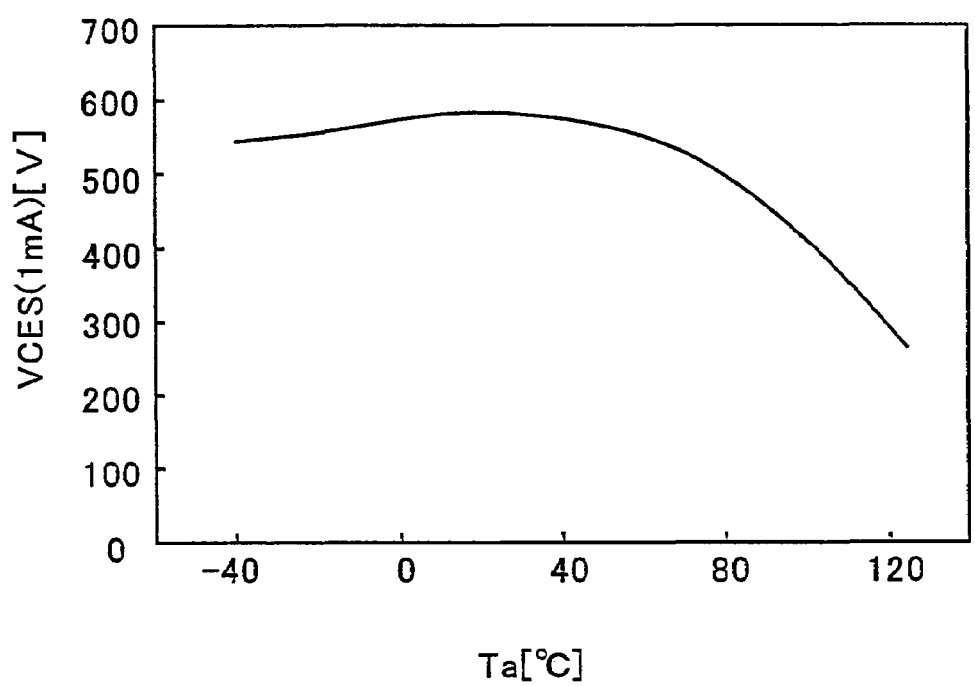
FIG. 19 is a characteristic diagram of the semiconductor device of FIG. 12 showing VCES as a function of temperature.

In the first embodiment, the significant difference from the conventional device of FIG. 12 is that the depth of the outermost peripheral trench 7a is shorter than those of other trenches. Other elements are similar to those in the conventional device. In this configuration, if the same drive voltage $V_0$ is applied, a depletion layer spreads in a similar manner to that shown in FIG. 12. In addition, since the distance from the outermost peripheral trench 7a to the P⁺ region 4a on the peripheral end portion of the channel layer 4 is also similar to that of the device of FIG. 12, the spread of the depletion layer toward the channel layer side is the same as that of the FIG. 12 and the maximum thickness of the depletion layer at respective portions is approximately equal to do, which is the same as that of the conventional device.

However, in the embodiment, the outermost peripheral trench 7a is shallow and the distance d2 from the bottom edge of the outermost peripheral trench 7a to the depletion layer edge that extends to the drain region 2 is greater than d11 of the conventional device. That is, the electric field intensity $E2$ ($=V_0/d2$) at the bottom edge of the outermost peripheral trench 7a shown in FIG. 1 is smaller than electric field intensity $E1$ ($=V_0/d11$) of the outermost peripheral trench 27a of the conventional device. Accordingly, the electric field concentration is relieved.

Figure 2:
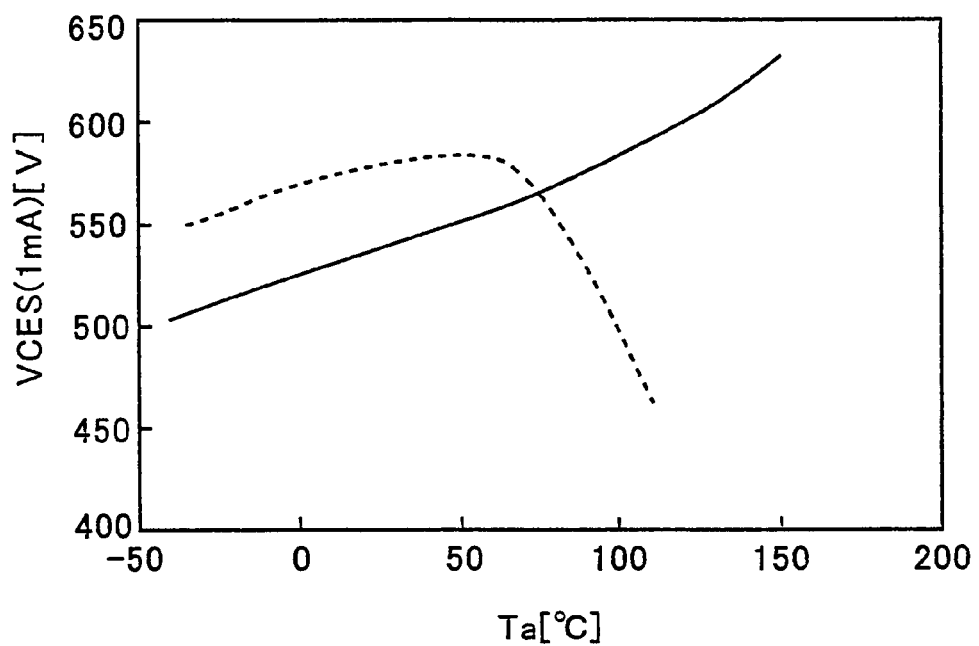
FIG. 2 is a characteristic diagram of the semiconductor device of FIG. 1 showing VCES as a function of temperature.

Thereby, a deterioration in high voltage strength between the source and the drain is suppressed, and the device performance at high temperatures is improved as shown in FIG. 2.

In FIG. 2, the solid line shows the performance of the device of this embodiment, and the dotted line shows the performance of the conventional device. As shown in this diagram, the VCES has a positive temperature coefficient in a range at an absolute maximum allowable temperature (Ta) of 150° C. Considering the fact that it has a negative temperature coefficient at an ambient temperature of 75° C. in the conventional device, the device performance is greatly improved.

Although a MOSFET is used as an example, the structure of the embodiment can also be applied to an IGBT.

Now, a method for manufacturing the semiconductor device of this embodiment will be described by use of FIG. 3 through FIG. 8. Herein, illustration of the P⁺ type region on the peripheral end portion of the channel layer is omitted.

Figure 3:
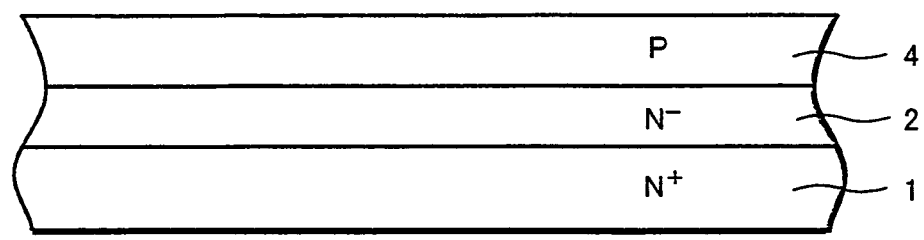
FIG. 3 is a sectional view of a device intermediate of a processing step for manufacturing the device of FIG. 1.

The first step is, as shown in FIG. 3, for forming, on a one-conduction-type semiconductor substrate surface to be a drain region 2, an opposite-conduction-type channel layer 4.

On an N⁺ type silicon semiconductor substrate 1, an N⁻ type epitaxial layer is formed to become a drain region 2. Into a predetermined channel layer peripheral end portion outside an operating area, a P type impurity of a high concentration is doped and diffused to form a P⁺ type region 4a. Furthermore, an impurity such as boron is doped with a dosage in the order of $10^{13}$ into the entire surface and is then diffused to form a P type channel layer 4.

In a case of an IGBT, if an N type epitaxial layer is provided in a P well region and an N⁻ type epitaxial layer is deposited thereon to form a collector region 2, the subsequent step can be carried out by an identical step.

Figure 4:
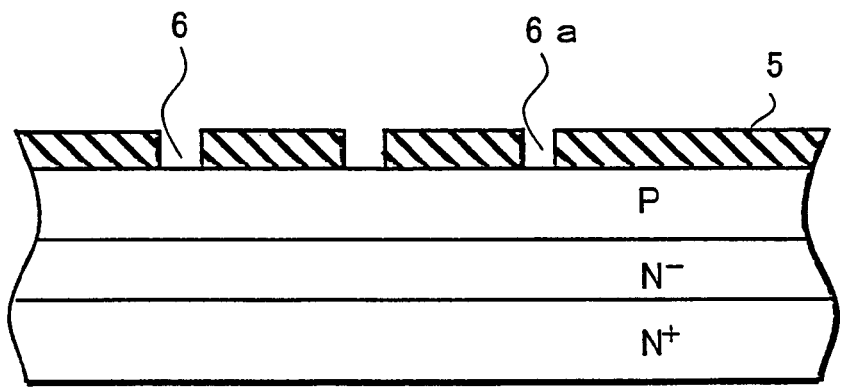
FIG. 4 is a sectional view of a device intermediate of a processing step for manufacturing the device of FIG. 1, following the step of FIG. 3.
Figure 5:
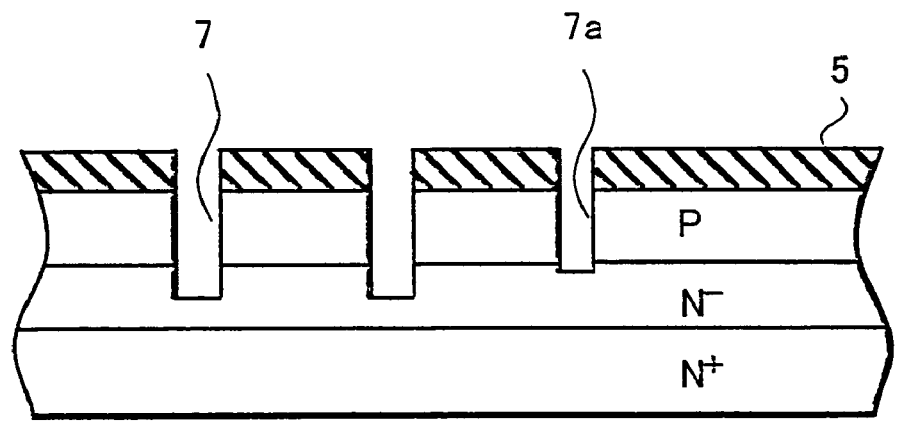
FIG. 5 is a sectional view of a device intermediate of a processing step for manufacturing the device of FIG. 1, following the step of FIG. 4.
Figure 6:
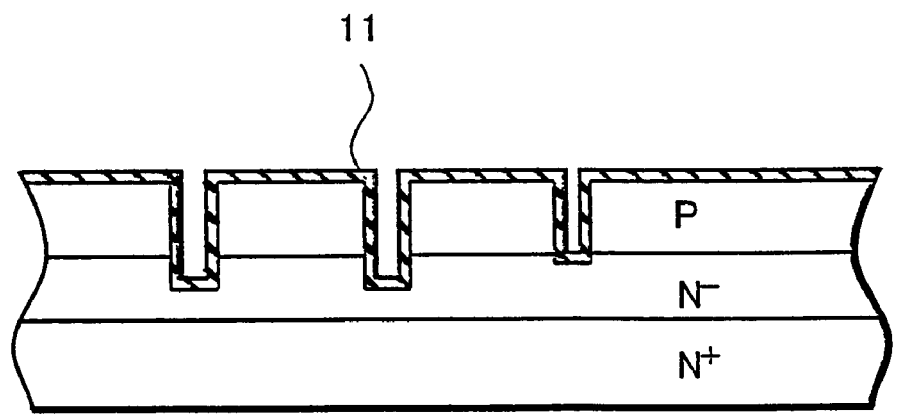
FIG. 6 is a sectional view of a device intermediate of a processing step for manufacturing the device of FIG. 1, following the step of FIG. 5.

The second is, as shown in FIG. 4 through FIG. 6, forming trenches which have different depths within the operating area and the outermost periphery thereof.

In FIG. 4, by a CVD method, an NSG (non-doped silicate glass) CVD oxide film 5 is deposited on the entire surface with a thickness of several thousand Å. Thereafter, using a mask made of a resist film formed on the film 5 except portions to become trench aperture portions 6, 6a, the CVD oxide film 5 is partially removed by dry etching so that the trench aperture portions where channel regions 4 are exposed are formed. At this time, an exposure is carried out by use of the mask having a pattern such that a trench aperture portion 6a at the outermost periphery of the operating area has a smaller aperture width than a trench aperture portion 6 within the operating area. In this embodiment, assuming that the trenches are arranged in a lattice form, the trench aperture portion 6 in the operating area has an aperture width of about of 1 µm, and the outermost peripheral trench aperture portion 6a has a width of 0.5 µm. The widths of the trenches formed with these trench apertures have approximately the same widths as the corresponding trench aperture widths, as shown in FIG. 5.

In FIG. 5, by use of the CVD oxide film 5 as a mask, the silicon semiconductor substrate at the trench aperture portions 6 and 6a is dry-etched with a CF gas and an HBr gas to form trenches 7, 7a. In general, a depth of a trench formed in an etching process is deeper when an aperture for trench formation is larger. Accordingly, since the aperture width is smaller at the outermost periphery, the trench 7a becomes shallower and narrower than those at other portions, and two types of trenches 7 and 7a different in depth and width are formed by one etching step. Herein, the outermost peripheral trench 7a need not have a depth to reach the drain region 2. Thereby, at the completion of the device, the electric field concentration at the bottom edge of the gate electrode (trench 7a) on the outermost periphery of the operating area is relieved.

Ordinarily, it becomes necessary to increase the number of steps with varying etching conditions to form trenches having different depths. However, in this embodiment, trenches having different depths can be simultaneously formed at an identical step by using apertures with different sizes. In other words, only by changing the mask pattern for trench etching of the conventional manufacturing processes, the electric field concentration at the bottom edge of the gate electrode can be relieved.

The third step is, as shown in FIG. 6, forming gate insulating films on the inner walls of the trenches 7, 7a.

As a dummy oxidation, an oxide film (not shown) is formed on the inner walls of the trenches 7, 7a and the surface of the channel layer 4 to remove etching damage during the dry etching, and thereafter, this oxide film and the CVD oxide film 5 are removed by etching.

Furthermore, by applying thermal oxidation to the entire surface, a gate oxide film 11 is formed with, for example, a thickness of approximately 700 Å based on the drive voltage.

Figure 7:
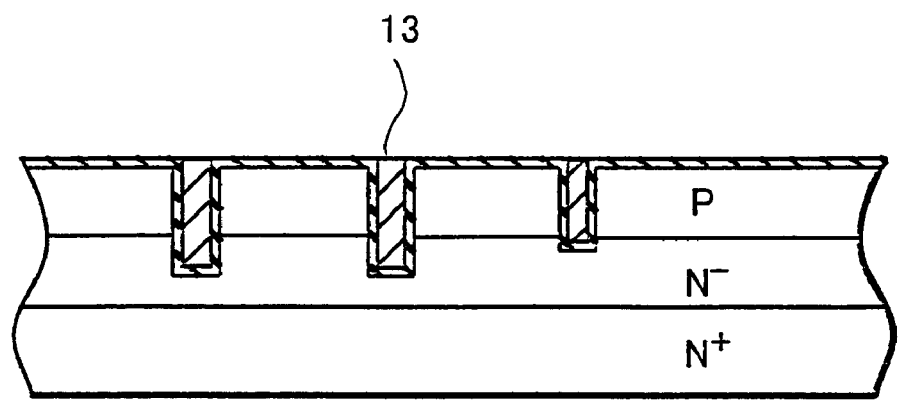
FIG. 7 is a sectional view of a device intermediate of a processing step for manufacturing the device of FIG. 1, following the step of FIG. 6.

The fourth step is, as shown in FIG. 7, forming electrodes which are made of a semiconductor material and fill the trenches 7, 7a.

A non-doped polysilicon layer is deposited on the entire surface, phosphorus is doped and diffused at a high concentration so as to realize a high conductivity, and gate electrodes 13 are formed. Thereafter, the polysilicon layer deposited on the entire surface is dry-etched without a mask so that the gate electrodes 13 filling the trenches 7, 7a are left.

Figure 8:
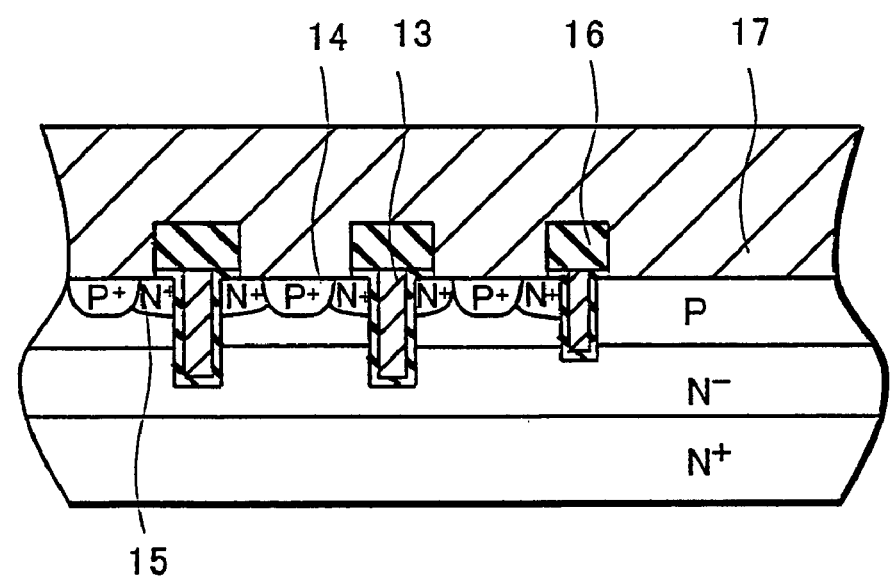
FIG. 8 is a sectional view of a device intermediate of a processing step for manufacturing the device of FIG. 1, following the step of FIG. 7.

The fifth step is, as shown in FIG. 8, forming one-conduction-type regions 15 on the channel layer 4 adjacent to the trenches 7, 7a.

First, in order to stabilize the potential of the substrate, an impurity such as boron is selectively ion-implanted by use of a mask made of a resist film with a dosage in an order of $10^{15}$ to form $P^+$ type body contact regions 14, and then the resist film is removed.

Thereafter, while masking is provided by a new resist film so as to expose predetermined source regions 15 and gate electrodes 13, arsenic is ion-implanted with a dosage in the order of $10^{15}$ to form $N^+$ type source regions 15 on the channel layer 4 surface adjacent to the trenches 7, and then the resist film is removed.

Furthermore, a BPSG (boron phosphorous silicate glass) layer is deposited on the entire surface by a CVD method so that an interlayer insulating film 16 is formed.

Thereafter, by use of a resist layer as a mask, the interlayer insulating film 16 is removed to leave at least the portions on the gate electrodes 13. Thereafter, aluminum is deposited on the entire surface by a sputtering device so that a source electrode 17 which makes contact with the source regions 15 and body contact regions 14 is formed.

Now, a second embodiment of the invention will be described in detail with reference to FIG. 9 through FIG. 11. According to the second embodiment, the trench depth in the vicinity of the outermost periphery of an operating area is provided so as to gradually become shallower toward the outermost periphery.

Figure 9:
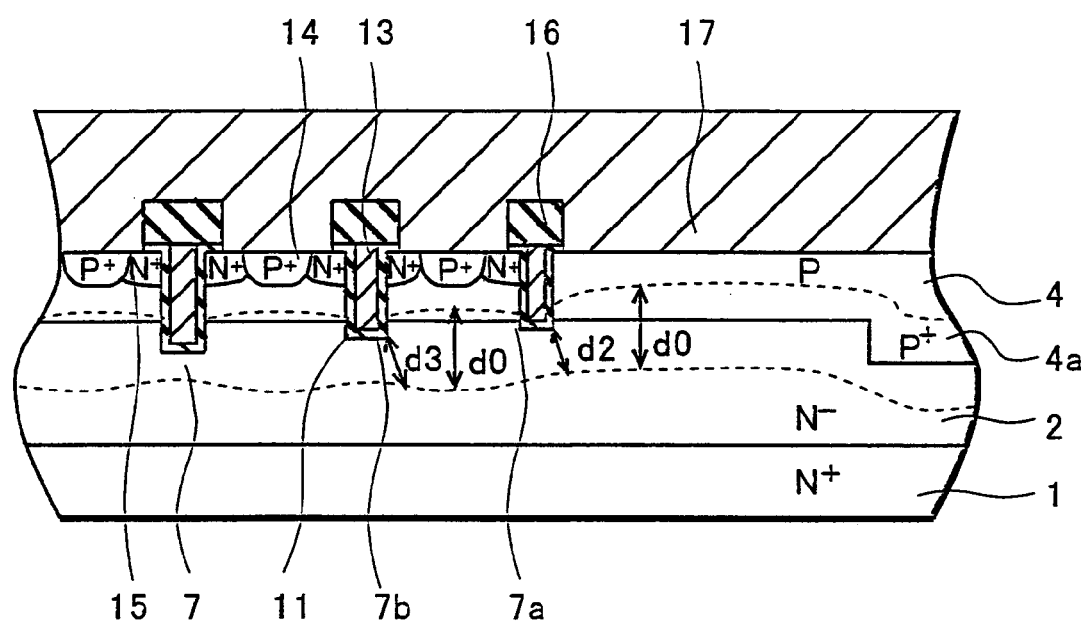
FIG. 9 is a sectional view of a semiconductor device of a second embodiment of the invention.

FIG. 9 shows a cross-sectional view of the second embodiment.

A trench-type power MOSFET of the second embodiment includes a semiconductor substrate 1 and 2, a channel layer 4, trenches 7, 7a and 7b, gate oxide films 11, gate electrodes 13, source regions 15, and a source electrode 17.

Herein, since constituent elements other than the trenches 7, 7a, and 7b are similar to those of the first embodiment, a detailed description thereof will be omitted.

The channel layer 4 is provided on the drain region 2 surface located on the semiconductor substrate 1, and the trenches 7, 7a, and 7b are provided in a manner penetrating completely or partially through the channel layer 4.

Most of the trenches 7 within the operating area are provided so as to penetrate through the channel layer 4 and reach the drain region 2, and are generally arranged in a pattern to form a lattice or strips on the semiconductor substrate.

In this embodiment, a plurality of trenches located in the vicinity of the outermost periphery of the operating area are provided so that the trench depth gradually becomes shallow toward the outermost periphery. For example, compared to trenches 7 in the operating area, trench 7a on the outermost periphery of the operating area has a shallower depth.

Furthermore, a trench 7b which is deeper than the outermost peripheral trench 7a and is shallower than the trenches 7 in within the operating area is provided in the area inside the outermost periphery (hereinafter, referred to as "periphery"). Namely, the trenches 7a at the outermost peripheral of the operating area have the shortest depth, the trenches 7b at the periphery have a second shortest depth, and other trenches within the operating area have a larger depth than the those trenches 7a, 7b. These trenches 7a and 7b need not reach the drain region 2. In this embodiment, depths of these trenches are as follows:

the operating area trenches 7=approximately 3 μm, the peripheral trench 7b= approximately 2.5 μm–3 μm, and the outermost peripheral trench 7a=approximately 2.5 μm.

On the inner walls of the trenches 7, 7a, and 7b, gate oxide films 11 are provided, and polysilicon fills the trenches to form gate electrodes 13. These gate electrodes 13 extend to a gate connecting electrode (not shown) surrounding the semiconductor substrate and are connected to a gate pad electrode (not shown) provided on the semiconductor substrate.

An $N^+$ type impurity is doped into the channel layer surface adjacent to the trenches 7, 7a, 7b, whereby source regions 15, which come in contact with the metal source electrode 17 that covers the operating area, are provided. On the channel layer surface between adjacent source regions 15, body contact regions 14, which are diffusion regions of $P^+$ type impurity, are provided, whereby potential of the substrate is stabilized.

The interlayer insulating film 16 is provided for insulation between the source electrode 17 and gate electrode 13, covering, at least, the gate electrode 13. A part of the film 16 is left at the trench openings.

The source electrode 17 is patterned into a desirable shape by sputtering aluminum or the like. This source electrode 17 covers the operating area and comes in contact with the source regions 14 and body contact regions 15.

A part surrounded by the adjacent trenches 7, 7a, and 7b forms one cell, and a plurality of such cells are aggregated to form the operating area.

According to this embodiment, at the vicinity of the periphery of the operating area, trenches 7a, 7b have two different depths.

In this case, when the device is off, a depletion layer spreads from a PN junction, under a reverse bias, at the interface between the channel layer 4 and drain region as shown by dotted lines in FIG. 9. Since the spread of the depletion layer and the width $d_0$ of the depletion layer are similar to those of the conventional device, the distance from the bottom edge of the peripheral trench to the depletion layer edge has the following relationship:

d1<d3<d2

As a result, the electric field intensity changes accordingly: E2<E3<E1. Thus the change in the electric field intensity is less enhanced.

Thereby, a deterioration in high voltage strength between the source and drain is suppressed.

This configuration may be also applied to an IGBT.

Now, a method for manufacturing the semiconductor device of the second embodiment will be described with reference to FIG. 10, FIG. 11, and FIG. 9. Herein, illustration of the $P^+$ type region on the peripheral end portion of the channel layer is omitted.

The first step is forming, on the one-conduction-type semiconductor substrate surface, an opposite-conduction-type channel region 4.

In a case of an IGBT, if an N type epitaxial layer is provided in a P well region and an N⁻ type epitaxial layer is deposited thereon to form a collector region 2, the subsequent step can be carried out by an identical step.

Figure 10:
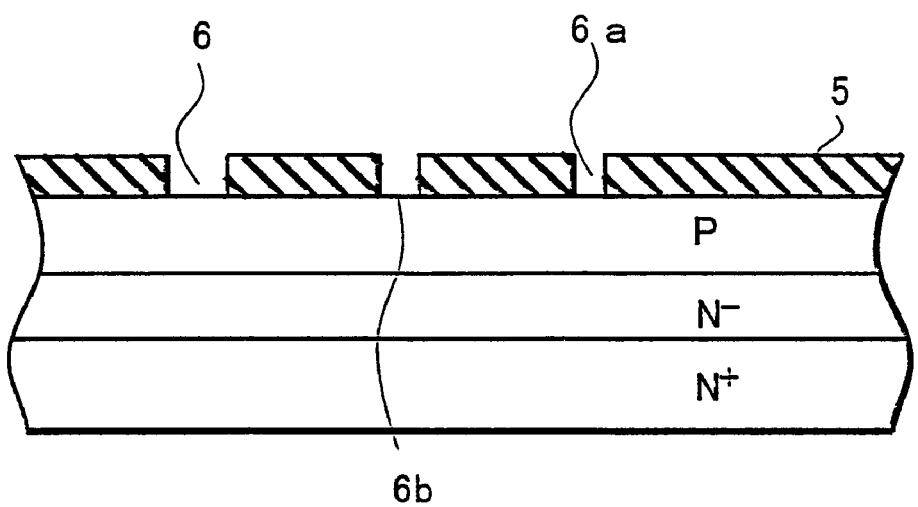
FIG. 10 is a sectional view of a device intermediate of a processing step for manufacturing the device of FIG. 9.
Figure 11:
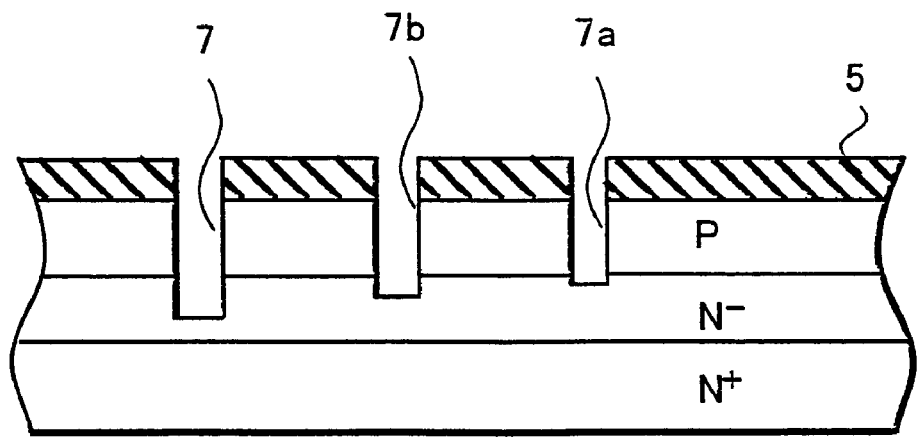
FIG. 11 is a sectional view of a device intermediate of a processing step for manufacturing the device of FIG. 9, following the step of FIG. 10.

The second step is forming trenches 7, 7a, 7b in a predetermined operating area so that the depth gradually becomes shallower in the vicinity of the outermost periphery of the predetermined operating area (FIG. 10 and FIG. 11).

In FIG. 10, by a CVD method, an NSG (non-doped silicate glass) CVD oxide film 5 is formed on the entire surface with a thickness of several thousand Å. Thereafter, using a mask made of a resist film formed on the film 5 except portions to become trench aperture portions 6, 6a, 6b, the CVD oxide film 5 is partially removed by dry etching so that the trench aperture portions 6, 6a, 6b where channel regions 4 are exposed are formed. The trench aperture portion 6a at the outermost peripheral has the smallest size, the trench aperture portion 6b at the periphery has a second smallest size, and the trench aperture portion 6 within the operating area has a larger size then others 6a, 6b. In this embodiment, the trench aperture portion 6 has a width in the order of 0.86 µm, the peripheral trench aperture portion has a width in the order of 0.5 µm, and the outermost peripheral trench aperture portion 6a has a width in the order of 0.38 µm. The widths of the trenches formed with these trench apertures have approximately the same widths as the corresponding trench aperture widths, as shown in FIG. 11.

In FIG. 11, by use of the CVD oxide film 5 as a mask, the silicon semiconductor substrate under the trench aperture portions 6, 6a, and 6b is dry-etched with a CF gas and an HBr gas to form trenches. In this process step, as mentioned above, since the aperture width varies (6>6b>6a), three types of trenches 7, 7b, and 7a, which are different in depth and width, are formed by one etching step. Herein, the peripheral trench 7b and outermost peripheral trench 7a need not have a depth to reach the drain region 2. In this configuration, the electric field concentration at the bottom edge of the gate electrode (trenches 7b and 7a) on the vicinity of the outermost periphery of the operating area is relieved.

Ordinarily, it is necessary to increase the number of steps with varying etching conditions to form trenches having different depths, however, in this embodiment, trenches having different depths are simultaneously formed by an identical step by varying the aperture width for trench etching. Since the trench aperture width can be narrowed to a limit of photolithography, a wide variety of trench depth and width is available to modify this embodiment. It is even possible to gradually change the depth from the center portion of the operating area to the outermost peripheral with the depth increment being determined by a spatial resolution of photolithography equipment. All this modification can be accomplished just by modifying the mask pattern accordingly.

The third step is forming gate oxide films 11 with a thickness of approximately 700 Å based on the drive voltage by thermally oxidizing the entire surface (refer to FIG. 6).

The fourth step is forming gate electrodes 13 made of a polysilicon layer filling the trenches (refer to FIG. 7).

The fifth step is forming, on the channel layer 4, one-conduction-type regions 15 adjacent to the trenches 7 and, for stabilizing the potential of the substrate, P⁺ type body contact regions 14 (refer to FIG. 8).

Furthermore, an interlayer insulating film 16 is formed. Thereafter, aluminum is deposited on the entire surface by a sputtering device to form a source electrode 17 which comes in contact with the source region 15 and body contact regions 14, thus a final structure shown in FIG. 9 is obtained.

Making only the trenches at the outermost peripheral sallower than others, as in the case of the first embodiment, sufficiently relieve the electric field concentration. However, making the trenches shallower in a gradual manner may be more effective in relieving the electric field concentration. However, when shallow trenches are formed in the central portion of the operating area, which do not reach the drain region, functions as a cell of a MOSFET are not provided. An increase of such trenches may influence operating characteristics. Therefore, when an object is to relieve the electric field concentration, the design of three different trench depths as shown in the second embodiment is sufficient.

What is claimed is:

1. A method for manufacturing a semiconductor device, comprising:
preparing a mask having a first aperture and a second aperture, the first and second apertures having different aperture sizes;
providing a semiconductor substrate; and
forming a first trench and a second trench in the semiconductor substrate using the mask in one process step,
wherein the first trench having a size is formed in an outermost peripheral portion of a predetermined area of the semiconductor substrate, and the second trench having a different size is formed in the predetermined area inside the outermost peripheral portion of the semiconductor substrate, the predetermined area corresponding to an operating area of the semiconductor device.

2. The method for manufacturing a semiconductor device of claim 1, further comprising forming a first transistor over the first trench and a second transistor over the second trench.

3. A method for manufacturing a semiconductor device, comprising:
forming a region of a first conduction type on a semiconductor substrate of a second conduction type;
forming a plurality of first trenches in an outermost peripheral portion of a predetermined area of the semiconductor substrate, the predetermined area corresponding to an operating area of the semiconductor device;
forming a plurality of second trenches in the predetermined area inside the outermost peripheral portion, the first trenches having a depth shorter than the second trenches;
forming insulating films on inner surfaces of the first and second trenches;
filling the first and second trenches with a semiconductor material to form electrodes; and
forming regions of the second conduction type in a surface of the region of the first conduction type, each of the regions of the second conduction type being adjacent one of the first and second trenches.

4. The method for manufacturing a semiconductor device of claim 3, wherein the regions of the second conduction type are formed so that a vertical channel is formed between each of the regions of the second conductivity type and the semiconductor substrate of the second conduction type.

5. The method for manufacturing a semiconductor device of claim 3, wherein the first and second trenches are formed so as to penetrate through the region of the first conductivity type and reach the semiconductor substrate of the second conductivity type.

6. A method for manufacturing a semiconductor device, comprising:

forming a channel layer of a first conduction type on a semiconductor substrate of a second conduction type, a surface of the semiconductor substrate corresponding to a drain region of the semiconductor device;

forming a plurality of first trenches in an outermost peripheral portion of a predetermined area of the semiconductor substrate, the predetermined area corresponding to an operating area of the semiconductor device;

forming a plurality of second trenches in the predetermined area inside the outermost peripheral portion, the first trenches having a depth shorter than the second trenches;

forming insulating films on inner surfaces of the first and second trenches;

filling the first and second trenches with a semiconductor material to form electrodes; and forming source regions of the second conduction type in a surface of the channel layer, each of the source regions being adjacent one of the first and second trenches.

7. The method for manufacturing a semiconductor device of claim 3 or 6, further comprising providing a mask having a plurality of first apertures for forming the first trenches and a plurality of second apertures for forming the second trenches, wherein a size of the first apertures is smaller than a size of the second apertures.

8. The method for manufacturing a semiconductor device of claim 6, wherein the source regions are formed so that a vertical channel is formed in the channel layer between each of the source regions and the drain region.

9. The method for manufacturing a semiconductor device of claim 6, wherein the first and second trenches are formed so as to penetrate through the region of the channel layer and reach the drain region.

10. A method for manufacturing a semiconductor device, comprising:

preparing a mask having a first aperture, a second aperture and a third aperture, each of the first, second and third apertures having a different aperture size;

providing a semiconductor substrate; and forming a first trench, a second trench and a third trench in the semiconductor substrate using the mask in one process step, wherein the first trench having a size is formed in an outermost peripheral portion of a predetermined area of the semiconductor substrate, and the second and third trenches having a different size are formed in the predetermined area inside the outermost peripheral portion of the semiconductor substrate, the predetermined area corresponding to an operating area of the semiconductor device.

11. A method for manufacturing a semiconductor device, comprising:

forming a region of a first conduction type on a semiconductor substrate of a second conduction type;

forming a plurality of first trenches in an outermost peripheral portion of a predetermined area of the semiconductor substrate, the predetermined area corresponding to an operating area of the semiconductor device;

forming a plurality of second trenches in the predetermined area inside the first trenches;

forming a plurality of third trenches in the predetermined area inside the second trenches, the second trenches having a depth shorter than the third trenches and longer than the first trenches;

forming insulating films on inner surfaces of the first, second and third trenches;

filling the first, second and third trenches with a semiconductor material to form electrodes; and forming regions of the second conduction type in a surface of the region of the first conduction type, each of the regions of the second conduction type being adjacent one of the first second and third trenches.

12. A method for manufacturing a semiconductor device, comprising:

forming a channel layer of a first conduction type on a semiconductor substrate of a second conduction type, a surface of the semiconductor substrate corresponding to a drain region of the semiconductor device;

forming a plurality of first trenches in an outermost peripheral portion of a predetermined area of the semiconductor substrate, the predetermined area corresponding to an operating area of the semiconductor device;

forming a plurality of second trenches in the predetermined area inside the first trenches;

forming a plurality of third trenches in the predetermined area inside the second trenches, the second trenches having a depth shorter than the third trenches and longer than the first trenches;

forming insulating films on inner surfaces of the first, second and third trenches;

filling the first, second and third trenches with a semiconductor material to form electrodes; and forming source regions of the second conduction type in a surface of the channel layer, each of the source regions being adjacent one of the first, second and third trenches.

13. The method for manufacturing a semiconductor device of claim 11 or 12, further comprising providing a mask having a plurality of first apertures for forming the first trenches, a plurality of second apertures for forming the second trenches and a plurality of third apertures for forming the third trenches, wherein a size of the second apertures is smaller than a size of the third apertures and larger than a size of the first apertures.

* * * * *